(12) United States Patent
Osanai (10) Patent No.: US 6,327,665 B1
(45) Date of Patent: Dec. 4, 2001

(54) PROCESSOR WITH POWER CONSUMPTION LIMITING FUNCTION

(75) Inventor: Takeki Osanai, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 08/960,363

(22) Filed: Oct. 29, 1997

(30) Foreign Application Priority Data

Oct. 29, 1996 (JP) .................................................. 8-286975

(51) Int. Cl.⁷ .................................. G06F 1/28; G06F 1/26
(52) U.S. Cl. ........................ 713/324; 713/310; 713/323; 713/340
(58) Field of Search ........................ 395/750.01, 750.02, 395/750.03, 750.04, 750.05, 750.06, 750.07; 713/300, 310, 320, 321, 322, 323, 324, 330

(56) References Cited

U.S. PATENT DOCUMENTS

| | | | |
|---|---|---|---|
| 4,698,655 | * | 10/1987 | Schultz ................................ 357/23.4 |
| 4,907,117 | * | 3/1990 | Pease et al. ............................ 361/54 |
| 5,167,024 | * | 11/1992 | Smith et al. .......................... 395/375 |
| 5,640,573 | * | 6/1997 | Gephardt et al. ..................... 395/750 |
| 5,761,517 | * | 6/1998 | Durham et al. .................. 395/750.04 |
| 5,781,783 | * | 7/1998 | Gunther et al. ................. 395/750.03 |
| 5,787,292 | * | 7/1998 | Ottesen et al. .................. 395/750.01 |
| 6,006,168 | * | 12/1999 | Schumann et al. ................... 702/132 |

FOREIGN PATENT DOCUMENTS 5-11898    1/1993  (JP) .

* cited by examiner

*Primary Examiner*—Robert Beausoleil
*Assistant Examiner*—Tim Vo
(74) *Attorney, Agent, or Firm*—Foley & Lardner (57) ABSTRACT

An incrementer (5a) adds 1 to the contents of a register (7a) in synchronism with a local clock. A register (7b) which has a bit width larger than that of the register (7a) is connected to an incrementer (5b). The incrementer (5b) adds 1 to the contents of the register (7b) in synchronism with a system clock. The local clock is terminated by an action of a NAND gate (9) when a most significant bit of the register (7a) becomes 1. The most significant bit of the register (7a) generates a full-bit clear signal (11) for the register (7b), and full bits of the register (7b) are then cleared to 0's when this full-bit clear signal becomes 1. A most significant bit of the register (7b) is a full-bit clear signal for the register (7a), and full bits of the register (7a) are then cleared to 0's when this full-bit clear signal becomes 1.

18 Claims, 5 Drawing Sheets

FULL-BIT CLEAR SIGNAL

PROCESSOR WITH POWER CONSUMPTION LIMITING FUNCTION

BACKGROUND OF THE INVENTION

1. Field of the Invention

The present invention relates to a processor with a power consumption limiting function and, more particularly, a power consumption controlling technique for the processor capable of avoiding, regardless of behavior of a program to be executed, that a quantity of generated heat due to power consumption exceeds a predetermined level.

2. Description of the Prior Art

Figure 1:
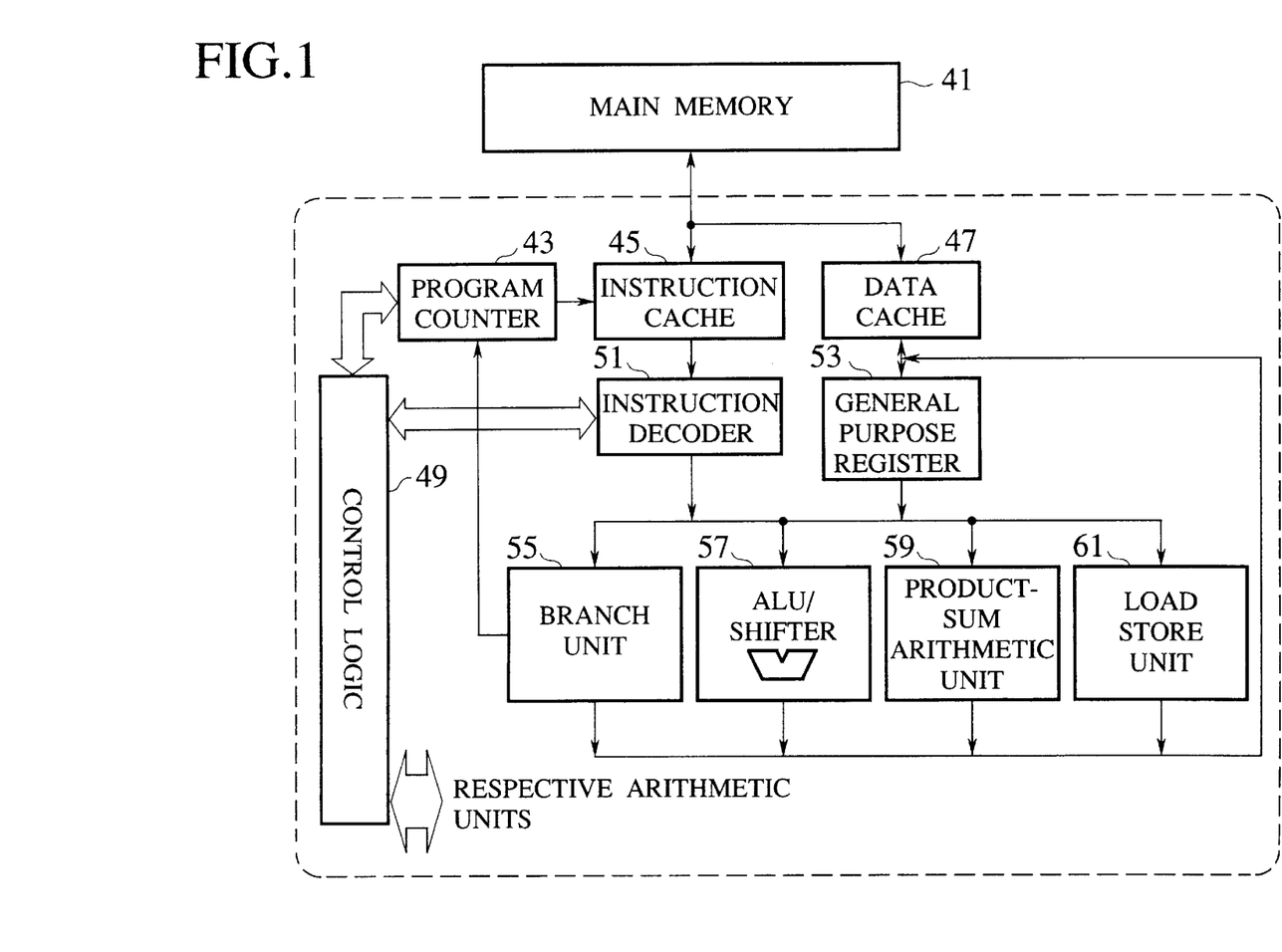
FIG. 1 is a block circuit diagram showing a configuration of an ordinary processor.

A conceptual view illustrating a configuration of a processor is shown in FIG. 1. The processor normally executes following operations. First an instruction designated by a program counter 43 is reads from an instruction memory 45, and then the contents of such instruction are converted into a control signal by an instruction decoder 51.

Data are read from a register or a main memory 41 according to the contents of the instruction. The data are then processed by arithmetic units which take charge of execution of the instruction. Processed results are then stored in the register or the memory.

In this case, the contents of the main memory is often cached into a high speed and small capacity memory (cache memory). In many cases, the memory which is accessed by the processor in operation signifies this cache memory.

In the event that the processor has to be constituted, taking account of these operations, it is almost indispensable to constitute mechanisms for executing respective functions as modules. As examples of such modules, there are arithmetic units such as ALU, functional blocks such as cache memory, general purpose register, etc., pipeline control logic circuits, and soon. Needless to say, there can be thought of various ways to classify the modules. Normally such modules are designed to have such a hierarchical structure that respective modules are constituted of smaller modules to take charge of smaller functions and operations. Thus it can be said in other words that FIG. 1 represents signals and data streams among the modules.

In the recent processors, a modular structure of a digital signal processor (abbreviated as "DSP" hereinafter) has been implemented. In particular, a number of microprocessors having the DSP function to deal with image data have been developed in recent years. In general, such DSP arithmetic unit having the DSP function has a high arithmetic performance to thus consume high electric power in its arithmetic operation (i.e., in operation). This is because, since generally arithmetic units having the higher arithmetic performance within the same number of cycle are designed to have a larger circuit scale, loads to be charged/discharged during operation become larger in size correspondingly.

Normally these DSP arithmetic units (for example, product-sum arithmetic unit, etc.) consume extremely high electric power compared to the arithmetic units (such as ALU, branch unit, etc.) installed in the microprocessor. Accordingly, in such microprocessors, power consumption of the overall processor is increased higher if the number of operation of these DSP arithmetic units is increased much more, while power consumption of the overall processor is decreased lower if the number of operation of these DSP arithmetic units is decreased much less.

Therefore, in the microprocessor including these DSP arithmetic units mixedly, power consumption is largely different according to a frequency of occurrence of the DSP instruction in the program to be executed, for the number of operation (frequency of operation, activation yield) of the DSP arithmetic units per unit time is largely varied during operation of the microprocessor according to such frequency of occurrence of the DSP instruction.

In fact, in the event that an image processing program to decompress compressed data is executed with the use of the DSP instruction, power consumption is required several times rather than that required when the program without the DSP instruction is executed.

The activation yield and the power consumption will then be mentioned hereunder. Present processors are often composed of potential transmitting devices. In such potential transmitting devices, power consumption is mainly caused because of charge/discharge of the loads in the circuit. Such power consumption will be explained with referring to a MOS device shown in FIG. 2 as an example.

Figure 2:
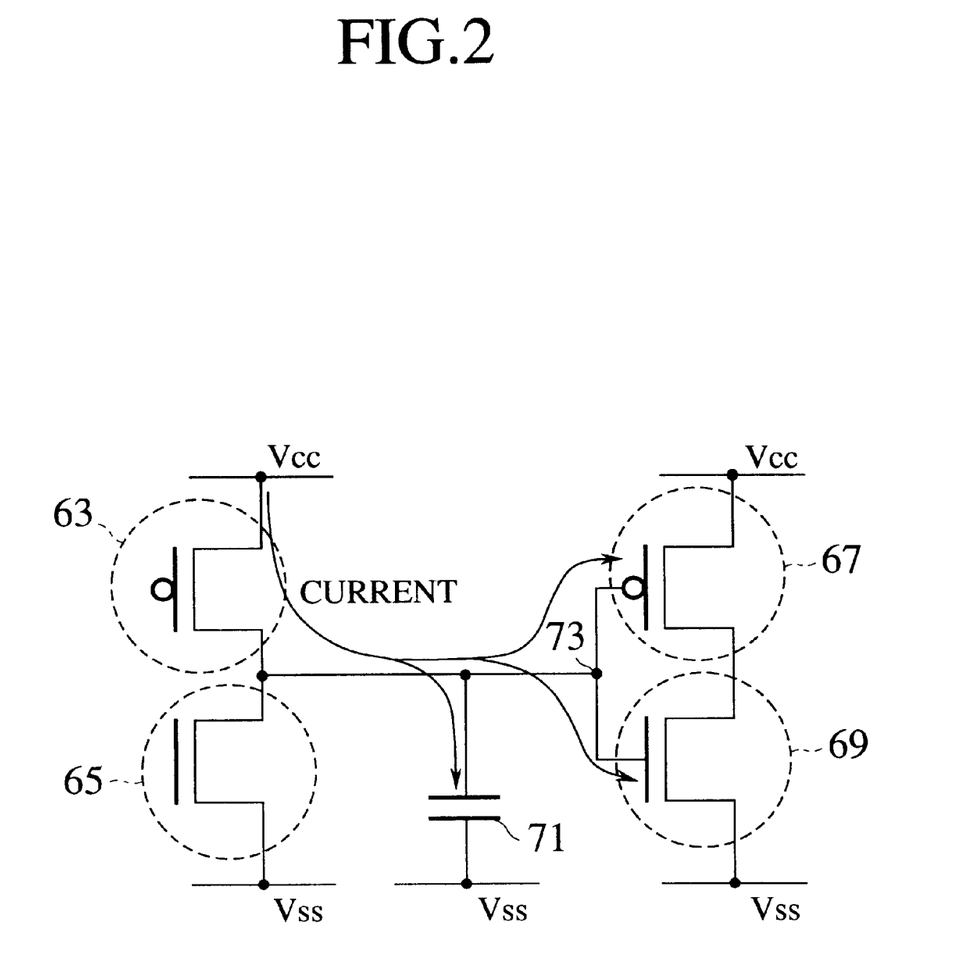
FIG. 2 is a view illustrative of an activation yield and power consumption in a PMOS device employed in the processor.

In FIG. 2, 63, 67 denote a PMOS respectively; 65, 69, an NMOS respectively; and 71, a capacitance which is parasitic on wirings, etc. Suppose that, in an initial state, a node 73 is set to the same potential as Vss, the PMOS 63 is in its OFF state, and the NMOS 65 is in its ON state. A current seldom flows in this state and therefore power consumption appears only to such an extent that it can be ignored.

Assume now that the PMOS 63 and the NMOS 65 are switched so that the PMOS 63 is turned to its ON state and the NMOS 65 is turned to its OFF state. Electric currents flow from Vcc to the capacitance 71, a gate capacitance of the PMOS 67, and a gate capacitance of the NMOS 69 via the PMOS 63 which has been ONed. At this time, electric power is consumed. Accordingly, the node 73 which has been at the same potential as Vss in the initial state can be charged up to Vcc by the currents. When the node 73 has been charged up to Vcc, the currents can be reduced to such an extent that they can be ignored (The major cause why such currents do not completely become zero is presence of a leakage current of the transistor). After the node 73 has been charged up to Vcc, similarly the power consumption can be reduced to such an extent that it can be ignored.

In this fashion, in the above potential transfer devices, power consumption is generated mainly due to charge/discharge of the load in the circuit. In other words, such power consumption is generated by switching the current sources to drive the load node (e.g., PMOS, NMOS in the above example). If there is no switching operation, power consumption is extremely small. Hence, the power consumption which is consumed by a certain load for a certain time is in proportion to how many times the load is charged/discharged for the certain time, i.e., how many times the driving sources are switched to charge/discharge the load. That is to say, the power consumption which has been consumed by the certain load for the certain time is proportional to the activation yield of the load within the certain time.

With the above configuration, the power consumption of the overall processor for the certain time can be derived by adding products of the magnitude of the load of the node and the activation yield of the node (i.e., power consumption at the node) for all nodes.

Since the processor is composed of a plurality of modules, power consumption of an overall processor can be detected by calculating a sum of power consumption at respective nodes module by module and then adding such sums for all modules.

In the prior art processor, under the assumption that several typical programs can be supposed, the activation yields of respective arithmetic units have been estimated and then an average power consumption of the overall microprocessor has been estimated based on the estimated activation yields. A product of the power consumption and an operation time can yield generated heat in the processor for the operation time. A package of the processor, if selected from a viewpoint of heat resistance, has been selected based on such generated heat. A mechanism for monitoring an operation state of the processor has not been installed in the processor itself.

In the above case, the package has been selected such that an expensive high heat-resistant package is employed so as to mate with peak power, or else an inexpensive low heat-resistant package is employed so as to mate with average power consumption.

However, in the case that the former package is employed and also the average power is small, package cost is of no use when the processor is being operated at the average power. Conversely, in the case of the latter package, the program has to assure that generated heat of the processor in no way exceeds the heat-resistant property of the package. If the program which enhances the power consumption is formulated and therefore generated heat of the processor exceeds the heat-resistant property of the package, such generated heat results in destruction of the package inevitably. In the event that the DSP processor is formed on a small scale or if the DSP processor is utilized only in a certain particular application, such package will offer no problem. However, in the event that, as the case in image processing field, the DSP processor has to be formed on a large scale and further many and unspecified applications are supposed to be used, formulation of such program to suppress such generated heat of the processor is very difficult.

Moreover, in the event that, when the system is constructed, an upper limit value of the power consumption required for the microprocessor has to be suppressed for some reason or other apart from the problem about to the heat resistance of the package, the program must assure to suppress the upper limit value of the power consumption. In fact, such assurance is rather difficult as a practical matter.

SUMMARY OF THE INVENTION

The present invention has been made in view of the above circumstances, and it is an object of the present invention to provide a processor with a power consumption limiting function which is capable of avoiding, regardless of behavior of a program to be executed, that generated heat due to power consumption exceeds a predetermined level.

In order to attain the above object, there is provided a processor with a power consumption limiting function, comprising: means for detecting or estimating an activation yield of a module included in the processor; and wherein the module or an overall system is shifted into a low power consumption operation mode when the activation yield of the module comes up to a predetermined value.

In order to attain the above object, there is provided a processor equipped with a plurality of modules and having a power consumption limiting function, comprising: a plurality of means for detecting or estimating a plurality of activation states of the plurality of modules respectively; and means for estimating an activation yield of an overall system based on the plurality of activation states which have been detected or estimated; wherein the overall system is shifted into a low power consumption operation mode when the activation yield of the overall system comes up to a predetermined value.

In order to attain the above object, there is provided a processor with a power consumption limiting function, comprising: means for detecting or estimating an activation yield of a module; and means for terminating an operation of the module when the activation yield of the module comes up to a predetermined value.

In the preferred embodiment of the present invention, the means for detecting or estimating the activation yield of the module includes, means for detecting that the module is in operation, and means for counting an operation time of an overall system, whereby the activation yield of the module can be detected or estimated by the detecting means and the counting means.

In order to attain the above object, there is provided a processor equipped with a plurality of modules and having a power consumption limiting function, comprising: a plurality of means for detecting or estimating a plurality of activation states of the plurality of modules respectively; and means for estimating an activation yield of an overall system based on the plurality of activation states which have been detected or estimated; wherein the plurality of modules are terminated in sequence from modules with higher termination priority when the activation yield of the overall system comes up to a predetermined value.

In the preferred embodiment of the present invention, the plurality of means for detecting or estimating the plurality of activation states of the plurality of modules respectively includes, means for detecting that the plurality modules are in operation respectively, and means for counting an operation time of the overall system, whereby the activation yields of the plurality of modules can be detected or estimated by the detecting means and the counting means.

In order to attain the above object, there is provided a processor with a power consumption limiting function, comprising: means for counting a number of operation clocks supplied to a module; means for counting a number of system clocks which are operation clocks supplied to an overall system; means for initializing the means for counting the number of operation clocks supplied to the module when the means for counting the number of system clocks can count the number of system clocks until a first predetermined value; and means for terminating an operation of the module when the means for counting the number of operation clocks supplied to the module can count the number of operation clocks until a second predetermined value.

In order to attain the above object, there is provided a processor equipped with a plurality of modules and having a power consumption limiting function, comprising: a plurality of means for counting a number of operation clocks supplied to the plurality of modules respectively; means for imposing predetermined weights module by module on the count results of the number of operation clocks supplied to the plurality of modules and then adding weighted count results; means for counting system clocks which are operation clocks supplied to an overall system; and means for initializing the plurality of means for counting the number of operation clocks supplied to the plurality of modules when the means for counting the system clocks can count the system clocks up to a first predetermined value; wherein, when predetermined weights are imposed module by module on count results of the number of operation clocks supplied to the modules and added to obtain a sum of weighted count results and then the sum of weighted count results comes up to a second predetermined value, the plurality of modules are terminated in sequence from modules with higher termination priority.

In the preferred embodiment of the present invention, the (first and second) predetermined value(s) is set in a register (s).

In the preferred embodiment of the present invention, the processor further comprises a register(s) indicating that the activation yield(s) of the module(s) or the overall system comes up to a limitation value, and wherein the register(s) is set when the activation yield(s) of the module(s) or the overall system comes up to the limitation value.

In the preferred embodiment of the present invention, the register is constituted to identify the module(s) whose activation yield(s) comes up to the limitation value.

In the preferred embodiment of the present invention, exception is generated when the activation yield(s) of the module(s) or the overall system comes up to the limitation value, and an exception handling program is executed.

In the preferred embodiment of the present invention, the count results are cleared when the activation yield(s) of the module(s) or the overall system comes up to the limitation value.

The module includes a macro or a group which takes charge of functions such as a register file and a cache memory other than an arithmetic unit.

In addition, for instance, a counter for counting the number of operation cycle of the module and a system clock counter for counting the number of system clocks may be provided to calculate the activation yield of the module. The activation yield can be calculated by counting how many times the module is operated every time when 1 is set at the most significant bit of the system clock counter. If the activation yield is in excess of a predetermined value, the module can be terminated.

In general, because the relationship between the activation yield of the module and power consumption of the module has been derived clearly in design stage of the processor, power consumption of the overall system can be suppressed less than a predetermined value by determining a maximum allowable activation yield beforehand.

According to the above present invention, power consumption (and generated heat) in the processor can be assured to be suppressed lower than a predetermined value irrespective of behavior of the program. Thus, the package with an appropriate cost can be employed.

The nature, principle and utility of the invention will become more apparent from the following detailed description when read in conjunction with the accompanying drawings.

DESCRIPTION OF THE PREFERRED EMBODIMENTS

Processors with a power consumption limiting function according to embodiments of the present invention will be explained with reference to the accompanying drawings hereinafter.

First Embodiment

Figure 3:
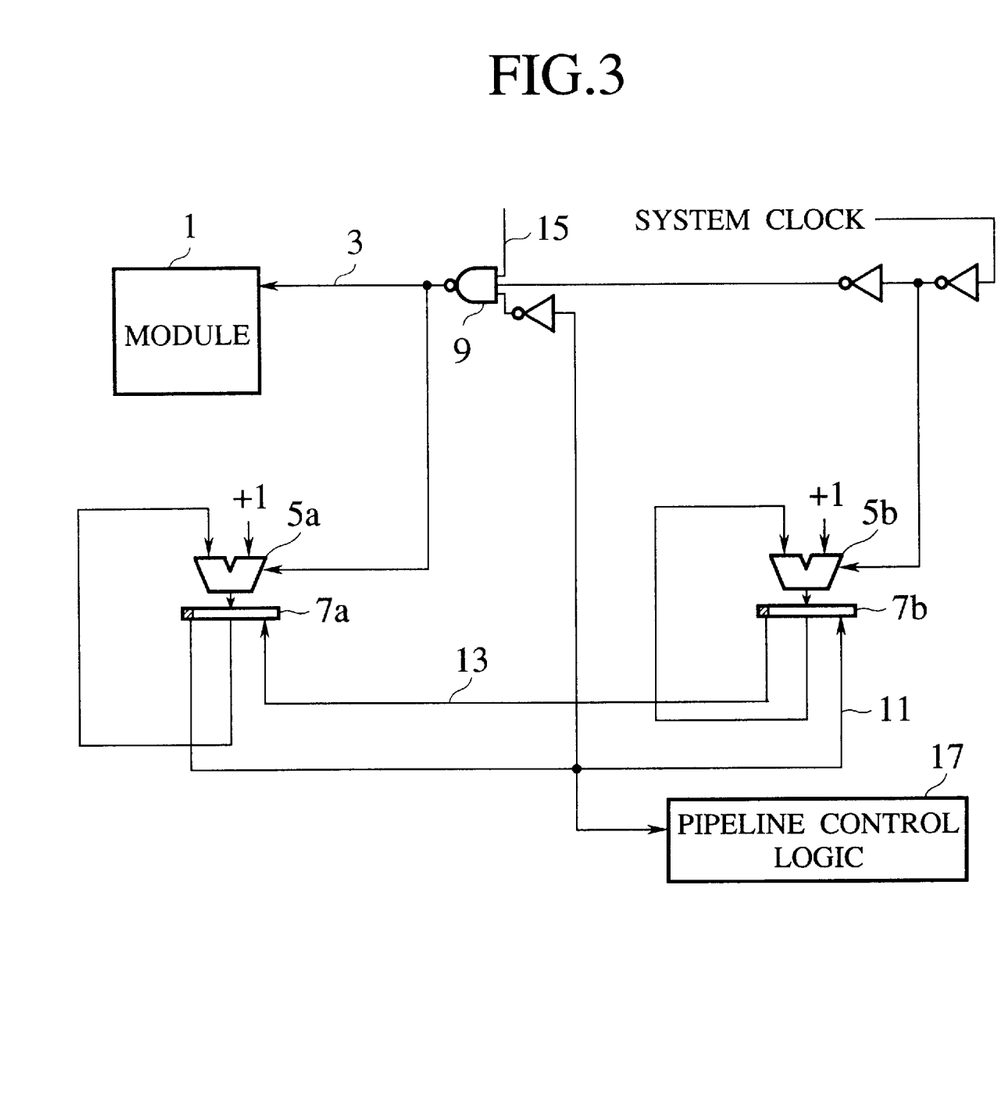
FIG. 3 is a block circuit diagram showing a processor with a power consumption limiting function according to a first embodiment of the present invention.

FIG. 3 shows a configuration of a processor with a power consumption limiting function according to a first embodiment of the present invention. A module 1 includes a macro or a group which takes charge of functions such as a register file and a cache memory other than an arithmetic unit. A clock pulse for the module 1 (referred to as a "local clock" hereinafter) are supplied via a wiring 3. The wiring 3 is also connected to an incrementer 5a. The incrementer 5a is then connected to a register 7a which can hold several tens bit data. In an initial state, a value 0 is set in the register 7a. The incrementer 5a is wired to add 1 to the contents of the register 7a in synchronism with the local clock.

Meanwhile, an incrementer 5b is connected to a clock pulse distributed to the overall processor (referred to as a "system clock" hereinafter). To the incrementer 5b is connected a register 7b which has a bit width larger than that of the register 7a. In an initial state, a value 0 is also set in the register 7b. The incrementer 5b is wired to add 1 to the contents of the register 7b in synchronism with the system clock.

A most significant bit in the register 7a is input into a NAND gate 9 via an inverter gate. The NAND gate 9 has the wiring 3 for supplying the local clock as its output. When the most significant bit in the register 7a becomes 1, the local clock is terminated by an action of the NAND gate 9. The most significant bit in the register 7a can generate a full-bit clear signal 11 for the register 7b and, when the full-bit clear signal becomes 1, full bits of the register 7b are then cleared to 0's.

A most significant bit in the register 7b is a full-bit clear signal for the register 7a and, when the full-bit clear signal becomes 1, full bits of the register 7a are then cleared to 0's via the wiring 13.

Next, an operation of the processor with the power consumption limiting function according to the first embodiment of the present invention will be explained with reference to FIG. 3 hereunder. At first, the registers 7a, 7b are set respectively to 0 in their initial state. When the processor starts its operation, the system clock is counted up by the incrementer 5b. The count number can be held in the register 7b. Normally the system clock is supplied all the time and as a result such count number is in proportion to an operation time.

In the meanwhile, the local clock is wired such that its supply to the module 1 can be controlled via a wiring 15 which transmits an operation enable signal for the module 1. The local clock is supplied to the module 1 only when the module 1 is to be operated. Since the contents of the register 7a is incremented +1 by +1 by the incrementer 5a in synchronism with the local clock, the register 7a can hold the number of operation of the module 1.

Incrementations of the contents of the registers 7a, 7b are advanced in parallel with each other, nevertheless an increment rate of the register 7a becomes slower than that of the register 7b since the module 1 is not operated except where it has to be operated. In the case that the frequency in the use of the module 1 is not high, the most significant bit of the register 7b comes up to 1 before the most significant bit of the register 7a becomes 1. When the most significant bit of the register 7b comes up to 1, the contents of the register 7a are cleared to 0's via the wiring 13 which can transmit the full-bit clear signal and at the same time full bits of the register 7b per se are cleared to 0's.

On the contrary, in the case that the frequency in the use of the module 1 is high, the most significant bit of the register 7a (whose bit width is set smaller than that of the register 7b) comes up to 1 before the most significant bit of the register 7b becomes 1. What the most significant bit of the register 7a has become 1 is transmitted to the NAND gate 9 which can then terminate supply of the local clock to the module 1, so that the operation of the module 1 is terminated. Simultaneously the register 7b is cleared to 0's by the full-bit clear signal 11. What the most significant bit of the register 7a has become 1 is also transmitted to a pipeline control logic, so that the pipeline can be controlled appropriately.

As evident from the above description, the bit width of the register 7b can define a sampling time to detect the activation yield. Also, the bit width of the register 7a can define the activation yield which is allowed for the module 1. According to this configuration, the frequency in the operation of the module 1 can be suppressed forcibly less than the activation yield which has been defined by the bit width of the register 7a with respect to the bit width of the register 7b.

Since power of the module 1 in operation as a single body becomes apparent in design stage, the activation yield allowed for the module 1 may be determined based on such power and the bit width of the register 7a with respect to the bit width of the register 7b may then be determined.

As the case in the first embodiment, if the activation yield of the module is calculated by some way and the module is then terminated when such activation yield reaches a certain value, power consumption of the processor can be suppressed so as to suppress power consumption of the module less than a predetermined level.

In the above first embodiment, the description concerning the activation yield of the module is given merely as one example. However, the method which is able to calculate the activation yield by counting the operation time of the overall system (the system clock executes such function in the above example) and then detecting that the module is in operation is one of effective methods.

Second Embodiment

Figure 4:
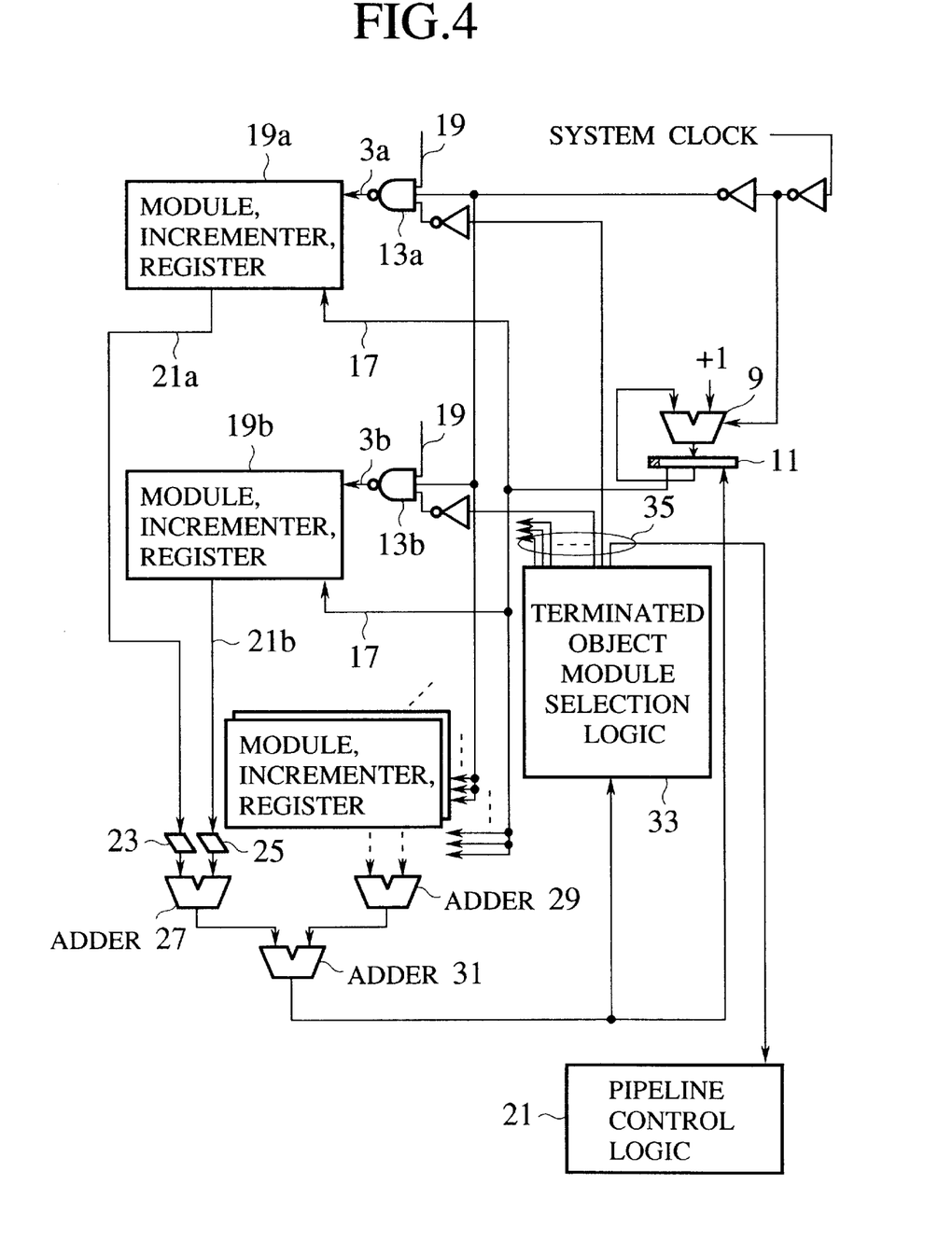
FIG. 4 is a block circuit diagram showing a processor with a power consumption limiting function according to a second embodiment of the present invention.
Figure 5:
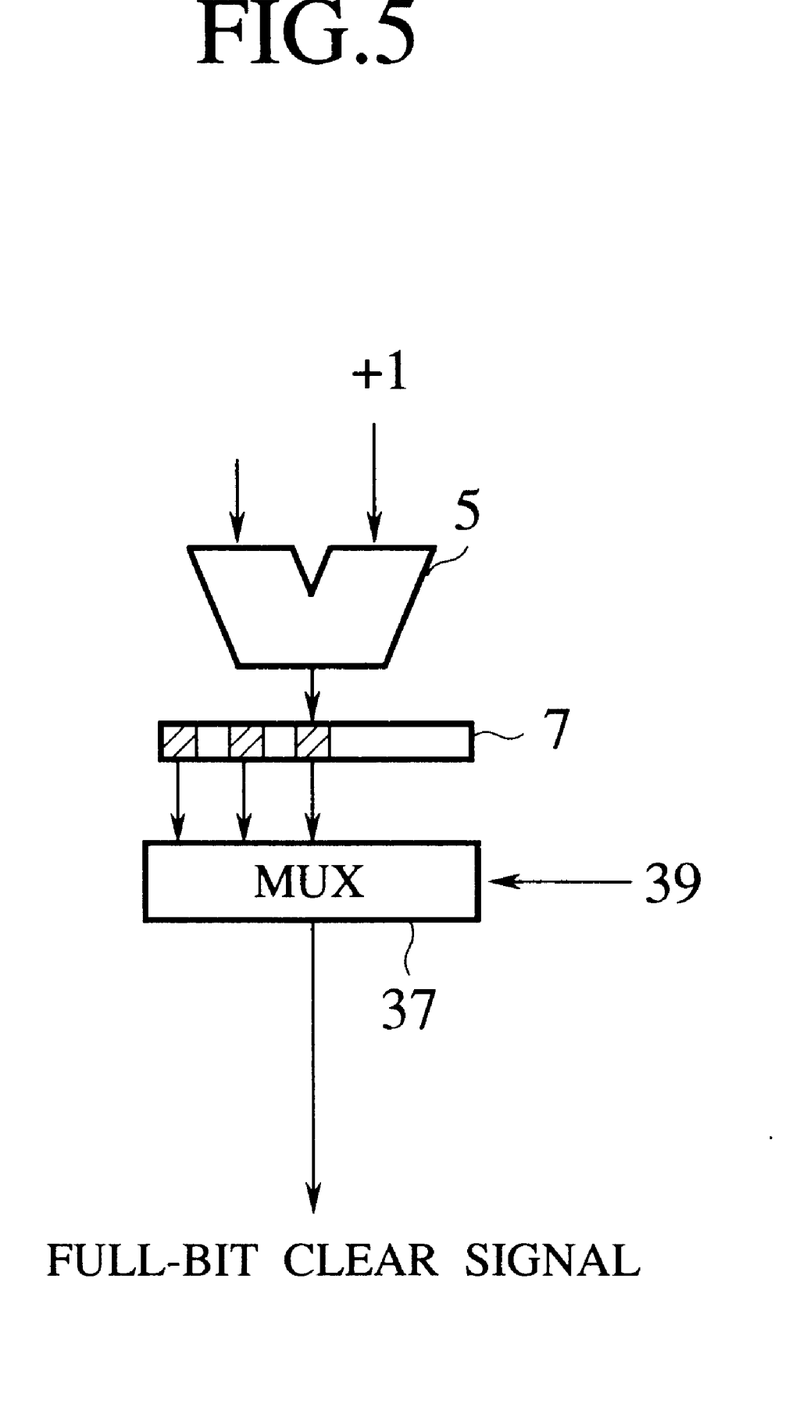
FIG. 5 is a block circuit diagram showing a configuration in which a value of a counter to generate a full-bit clear signal for a register can be made variable.

Next, a processor with a power consumption limiting function according to a second embodiment of the present invention will be explained with reference to FIGS. 4 and 5 hereinafter. In the second embodiment of the present invention, counters are provided in a plurality of modules. A clear signal for the system clock counters is generated based on what the counter values in these modules are processed and a sum of processed values is then calculated. The contents of such process is a weighting operation for the counter values based on the difference in power consumption of respective modules as single bodies. When a sum of the counter values in such module and other modules is calculated, the counter values in the module which consumes a high power as the single body act as a heavy weight rather than those in other modules. Thus, a total sum of the power can be estimated closely to the actual circumstances from the counter values which indicate operating conditions of plural modules each having different power consumption as a single body. In addition, such a configuration can be realized that, when a plurality of modules are going to be terminated, the modules are not terminated all together but in predetermined sequence. If the processor is so constructed, operations of respective modules can be controlled much more finely. The above configuration, when realized, is shown in FIG. 4. In this configuration, the weighting operation of the module can be achieved by bit-shifting counter outputs in respective modules by a preselected amount module by module and then adding such shifted counter outputs. A total sum of the counters in respective modules is sent to a terminated object module selection logic 33. After the modules to be terminated are selected, a signal for terminating the local clock for the object modules is generated.

As in the embodiment depicted in FIG. 4 and explained in the above, power consumption can be controlled throughout the processor by detecting the activation yields of individual modules according to some way, then estimating overall power consumption based on the values of the activation yields, and then terminating the modules in preselected sequence when such estimation value reaches a certain value.

Also, the description concerning the activation yield of the module provides merely one example herein. However, the method which is able to detect the activation yield by counting up the operation time of the overall system (the system clock acts such operation in the above example) and then detecting that the modules are in operation is also one of effective methods.

In the above embodiments, the module has been terminated in both cases when the activation yield reaches its upper limit. Of course, it may be thought out that the module is not terminated, but the modules or the overall system can be shifted into their some low power consumption mode. As examples of the low power consumption mode, reduction in the frequency, decrease of the supply voltage, and so forth may also be thought out. But various approaches may of course be considered together with the above two examples.

Furthermore, in the above embodiments, the activation yields have been detected from the operation clock and the system clock supplied to the modules. In addition to this, the activation yield may be detected by attaching a valid bit to the module and then detecting the cycle number in which such valid bit is set to 1, or else such an approach may be through out that change in data which is passed through the data path may be utilized.

Although the register widths in the counters have been fixed in the above description, it is also possible to designate a bit to generate a register clear signal if such bit to generate the register clear signal can be set in the control register. In the event that such configuration may be adopted, the registers 7a, 7b and their peripheral circuits shown in FIG. 3 may be constituted respectively as shown in FIG. 5. In this case, since the counter values to generate the register full-bit clear signal can be made variable according to the contents of the registers, a maximum frequency of the operation of the module can be made variable.

When the module comes up to the maximum allowable activation yield, it is feasible to set the control register according to the register clear signal. Like this manner, by referring to such control register, the processor can detect that some modules have reached the maximum allowable activation yield. In addition, if a configuration is employed wherein the control register can be accessed via an external pin of the processor, it is convenient that such configuration makes it possible to monitor the operation state from the external out of the processor.

A plurality of such registers may be prepared to be installed in each module. With this configuration, operation states of individual modules can be found by referring to the control register. If individual registers are so constituted that they can be accessed via external pins, operation states of respective modules can be monitored from the external of the processor. Hence, it is needless to say that finer control can be carried out as an overall system.

These devices may be so constituted that, if the module reaches the maximum activation yield, an exception is generated (an exception signal is generated from the register signals) and the process is then shifted to an exception handling program. In addition, by using a function of the exception handling program, the module can return appropriately to its normal mode from its termination state or its low power consumption mode.

If the module reaches the maximum activation yield, it is possible to generate the exception and simultaneously to clear the registers in the counters. In this case, since the hardware can assure to clear the counters, a routine to clear the counters can be removed from the exception handling program.

As has explained earlier, according to the processor with the power consumption limiting function according to the present invention, the microprocessor is able to assure power consumption (and generated heat) less than a predetermined value regardless of behavior of the program. Accordingly, a manufacturing cost of the processor can be reduced since the package can be employed at a proper cost.

It should be understood that many modifications and adaptations of the invention will become apparent to those skilled in the art and it is intended to encompass such obvious modifications and changes in the scope of the claims appended hereto.

What is claimed is:

1. A processor, which includes a module with a power consumption limiting function, comprising:
   a first timer which measures a module operation time;
   a second timer which measures an overall system operation times; and
   a circuit which obtains an amount per unit time the module is being used based on a ratio of the measured module operation time to the measured overall system operation time,
      wherein said module or said overall system is shifted into a low power consumption operation mode when said amount comes up to a predetermined upper limit value.

2. A processor according to claim 1, wherein a frequency of a clock signal supplied to said module or an overall system is decreased when said module or said overall system is shifted into said low power consumption operation mode.

3. A processor according to claim 1, wherein a voltage supplied to said module or an overall system is lowered when said module or said overall system is shifted into said low power consumption operation mode.

4. A processor according to claim 1, wherein said first timer for measuring a module operation time includes a first register for accumulating a count number of local clock pulses provided to the module, and said second timer for measuring an overall-system operation time includes a second register for accumulating a count number of system clock pulses.

5. A processor according to claim 1, wherein an exception is generated to execute an exception handling program, when said amount comes up to said predetermined value.

6. A processor according to claim 4, wherein, when a predetermined bit of the second register is set, the first and second registers are reset, and when a predetermined bit of the first register is set, the second register is reset.

7. A processor according to claim 6, wherein each of the predetermined bits of the first and second registers is arbitrarily determined.

8. A processor according to claim 6, wherein said predetermined value is determined by a ratio of the capacity of the first register limited by the predetermined bit thereof to the capacity of the second register limited by the predetermined bit thereof.

9. A processor with a power consumption limiting function, comprising:
   a circuit which detects or estimates an amount per unit time a module is being used; and
   a circuit which terminates an operation of said module when said amount comes up to a predetermined upper limit value,
   wherein said circuit for detecting or estimating said amount includes:
      a circuit which measures a module operation time;
      a circuit which measures an overall-system operation time; and
      a circuit which obtains said amount based on a ratio of the measured module operation time to the measured overall-system operation time.

10. A processor according to claim 9, wherein a first timer for measuring a module operation time includes a first register for accumulating a count number of local clock pulses provided to the module, and a second timer for measuring an overall-system operation time includes a second register for accumulating a count number of system clock pulses.

11. A processor according to claim 9, wherein an exception is generated to execute an exception handling program, when said amount comes up to said predetermined value.

12. A processor according to claim 10, wherein, when a predetermined bit of the second register is set, the first and second registers are reset, and when a predetermined bit of the first register is set, the second register is reset.

13. A processor according to claim 12, wherein each of the predetermined bits of the first and second registers is arbitrarily determined.

14. A processor according to claim 12, wherein said predetermined value is determined by a ratio of a capacity of the first register limited by the predetermined bit thereof to a capacity of the second register limited by the predetermined bit thereof.

15. A processor equipped with a plurality of modules and having a power consumption limiting function, comprising:
   a plurality of means for counting a number of operation clocks supplied to said plurality of modules respectively;
   means for imposing predetermined weights module by module upon said count results of said number of operation clocks supplied to said plurality of modules and then adding weighted count results;
   means for counting system clocks which are operation clocks supplied to an overall system; and
   means for initializing said plurality of means for counting said number of operation clocks supplied to said plurality of modules when said means for counting said system clocks can count said system clocks up to a first predetermined value;
   wherein, when predetermined weights are imposed module by module upon count results of said number of operation clocks supplied to said modules and added to obtain a sum of weighted count results and then said sum of weighted count results comes up to a second predetermined value, said plurality of modules are terminated in sequence from modules with higher termination priority.

16. A processor according to claim 15, each of the first and second predetermined value is arbitrarily determined.

17. A processor according to claim 15, wherein an exception is generated to execute an exception handling program, when said sum of weighted count results comes up to the second predetermined value.

18. A processor according to claim 9, wherein said means for detecting or estimating said amount includes:

means for measuring a module operation time;

means for measuring an overall-system operation time; and means for obtaining an amount based on a ratio of the measured module operation time to the measured overall-system operation time.

* * * * *